(12) United States Patent
Sandusky

(10) Patent No.: US 6,268,753 B1
(45) Date of Patent: Jul. 31, 2001

(54) DELAY ELEMENT THAT HAS A VARIABLE WIDE-RANGE DELAY CAPABILITY

(75) Inventor: Randall L. Sandusky, Divide, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/544,825

(22) Filed: Apr. 6, 2000

Related U.S. Application Data

(63) Continuation of application No. 09/060,249, filed on Apr. 15, 1998, now abandoned.

(51) Int. Cl.[7] ................................................. H03H 11/26
(52) U.S. Cl. ............................ 327/266; 327/274; 327/278
(58) Field of Search ........................... 327/261, 262–264, 327/266, 269–272, 274, 276, 280, 284, 287, 288, 359, 278

(56) References Cited

U.S. PATENT DOCUMENTS 4,165,490 * 8/1979 Howe et al. .......................... 327/172
5,712,582 * 1/1998 Yokota et al. ...................... 327/156

* cited by examiner

*Primary Examiner*—Timothy P. Callahan
*Assistant Examiner*—Minh Nguyen
(74) *Attorney, Agent, or Firm*—W. Daniel Swayze, Jr.; W. James Brady; Frederick J. Telecky, Jr.

(57) ABSTRACT

A precision wide-range variable delay system whose delay is independent of process, voltage, and temperature variations. A delay controller supplies a voltage, that is independent of process, voltage, and temperature variations, and that is used in a delay line to set the amount of delay through all individual delay elements cascaded together inside of the delay line. The number of cascaded delay elements determines the maximum delay of the delay system. An output voltage controller regulates the output voltage swing of the output from the delay system for stability of the delay over voltage variations. The desired delay from the system is variable and is determined by the user. The pre-delay timing relationships of multiple signals, that are delayed, is maintained by the delay system.

14 Claims, 6 Drawing Sheets

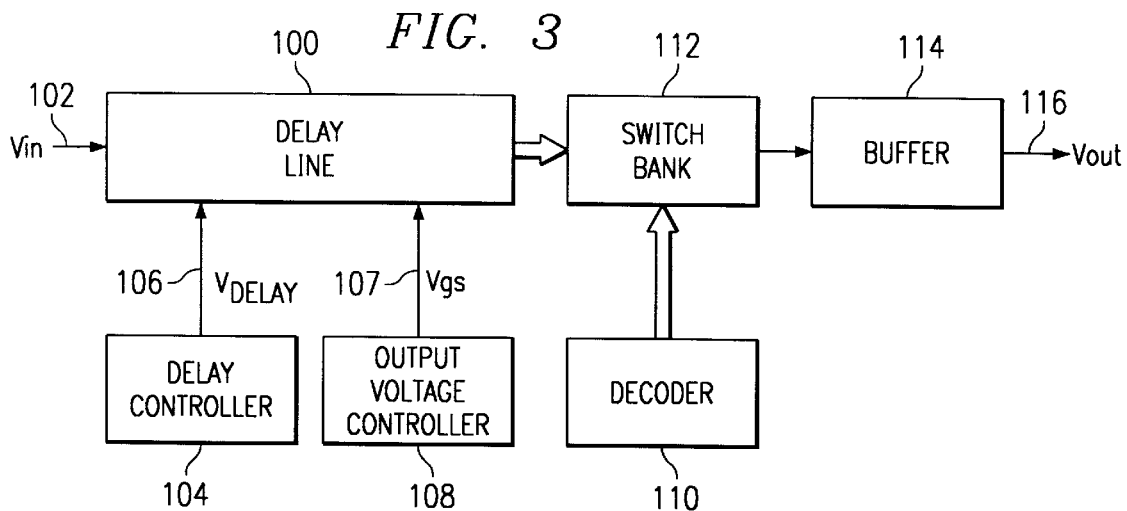
FIG. 3
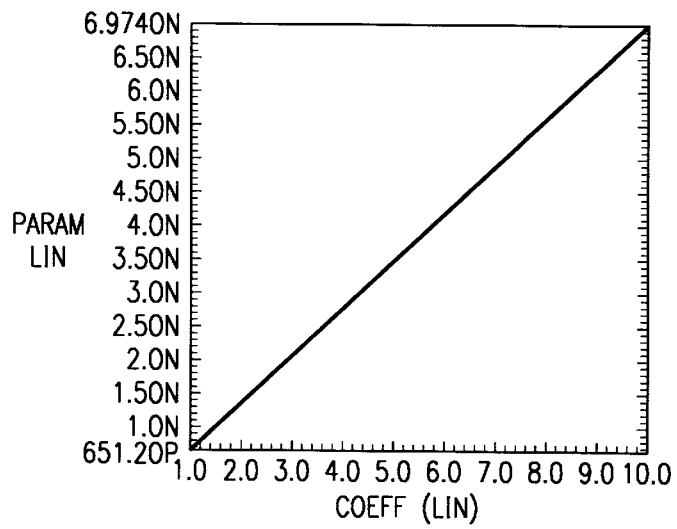
FIG. 7
FIG. 8

US 6,268,753 B1

DELAY ELEMENT THAT HAS A VARIABLE WIDE-RANGE DELAY CAPABILITY

This application is a continuation of application Ser. No. 09/060,249, filed Apr. 15, 1998 which is now abandoned.

BACKGROUND OF THE INVENTION

1. Field of the Invention

The present invention relates to the field of signal delay systems, and more particularly, to digital signal variable delay systems.

2. Description of the Related Art

Two commonly used methods of variable delay systems are MOS-based and ECL-based delay systems. FIG. 1a shows a MOS-based method for the delay of digital signals. The inverter stages, comprised of MOSFET pairs 10 and 12, 14 and 16, 18 and 20, and 22 and 24, are used to delay the input signal (Vin) 26. Multiple delay elements 30, 32, 34, 36 denoted as $D_o$–$D_x$ are cascaded together to obtain the desired delay from input signal Vin 26 to output signal (Vout) 28. Due to the variable resistance characteristics of MOSFET devices, the delay through each inverter stage can be varied by changing the conductance of each MOSFET pair, 10 and 12, 14 and 16, 18 and 20, and 22 and 24, conductance being inversely proportional to the resistance. This is achieved by varying the gate-to-source voltage, Vgs, of each MOSFET device with the control voltage (Vc) 38. As voltage 38 is increased, the drain-to-source conductance, Gds, through each inverter stage, 10 and 12, 14 and 16, 18 and 20, and 22 and 24, is also increased, thus reducing the delay through each delay element 30, 32, 34, 36. Similarly, decreasing voltage 38 increases the delay time by decreasing Gds.

Typically, the propagation delay of CMOS devices can vary widely due to process, voltage, and temperature variations. Process variations in the width and thickness of the diffusion and oxide layers can produce variations in device performance. In addition, the drain current of CMOS devices decreases as the temperature increases, which causes an increase in propagation delay. Moreover, voltage variations also affect the delay characteristics. All of these variations must be compensated to obtain predictable and tightly controlled delays in MOS-based delay circuits such as the example given in FIG. 1a. This requires the means to calibrate or tune the delay circuit to obtain a desired delay characteristic over all conditions of process, voltage, and temperature.

One such method for calibration and tuning used in prior art applications is shown in FIG. 1b. The inverter-based delay line of FIG. 1a is shown as a block diagram 48 in FIG. 1b, configured with a block diagram of a Phase-Locked Loop (PLL) 40. The PLL shown is comprised of a voltage-controlled ring oscillator (VCO) 42, a frequency divider 44, and a phase detector 46. The VCO 42 is a separate delay line with a feedback path from the delay line's output to its input. The VCO 42 delay line is identical to the delay line 48. The oscillation frequency of the VCO 42 is determined by the number of delay elements 30,32,34,36 in the VCO 42, and the propagation delay through each element which is controlled by control voltage 54. Since the delay line 48 is identical to the VCO delay line 42, a known delay can be specified by setting the frequency of VCO 42 to a known value. The output of VCO 42 is divided down by divider 44 and output at 56 (Fout/N). The phase detector 46 compares the phase and frequency of Fref 50 with the frequency out 56 (Fout/N) of the divider 44 and adjusts control voltage Vc 54 accordingly. If frequency Fref 50 is less than the frequency 56 (Fout/N), then the phase detector 46 decreases Vc 54. The amount of delay from Vin 26 to Vout 28 can be accurately controlled by the action of the PLL 40, which adjusts the matching VCO 42 to lock to the input reference frequency, Fref 50. Various delays can thus be achieved by proper selection of the Fref 50 input frequency and the 1/N frequency divider 44. Accordingly, use of a PLL 40 allows tightly controlled delays that are not sensitive to process, voltage, and temperature.

Even though inverter-based delay elements, such as those shown in FIG. 1a, have been widely used for delay generation in MOS integrated circuit (IC) designs, their use has generally been reserved for non critical delays when tightly controlled delays, that might require a compensation means to insure delay precision, are not required. The approach of FIG. 1b is not desirable for many applications due to the requirement of the PLL 40, which will consume additional area and power. Furthermore, the additional clock switching noise contributed by the reference voltage input 50 and the PLL 40 logic circuits can adversely affect the performance of the other circuit sections on the IC, such as the delay elements, and thus cannot be ignored as well.

FIG. 2 shows an ECL-based method for the delay of digital signals. In its simplest form, an ECL-based delay element can be constructed as shown in FIG. 2a. Here, differential input signals 60 and 62 are delayed by the emitter-coupled differential pair comprised of transistors 66 and 68. The collector voltages of the differential pair are buffered by emitter followers 70 and 72 for interfacing of the output signals 74 and 76 to subsequent delay stages. The delay of this delay element can be varied by changing the voltage at the base of transistor 78, the Vx input 64. As the Vx voltage 64 increases, the current through resistors 80 and 82 also increases, thus decreasing the delay through the delay cell. This type of approach suffers from the same limitations as the MOS-based delay elements of FIG. 1 since the delay of the delay elements in FIG. 2a is highly dependent upon process, voltage, and temperature variations.

Improvements to the circuit of FIG. 2a can be made if MOSFET devices are used, such as would be true on a BICMOS integrated circuit. In FIG. 2b PFETs 84 and 86 have been added in parallel to resistors 80 and 82 to provide another means for controlling the delay through the delay element. As the Vgs voltage 88 increases in the negative direction, the Gds of the PFETs 84 and 86 also increases, reducing the resistance at the collectors of 66 and 68. Addition of the capacitors 90 and 92 serves to extend the range of the delay as may be desired by the user, due to the capacitors' charging/discharging time. Capacitors 90 and 92 also serve to swamp the parasitic capacitances, which may be present at the transistor collectors, thus reducing the effect of the device parasitics on the delay generation As in FIG. 2a, the delay through the delay element can be varied by changing the control voltage 64. At the same time, however, the Vgs voltage 88 can also be varied to maintain a constant voltage swing at the collectors of transistors 66 and 68 by causing a set resistance across resistors 80 and 82 that is constant regardless of temperature and voltage. As Vgs 88 increases in the negative direction, the resistance across resistor 80 approaches that of a short circuit. As Vgs 88 decreases, the resistance across resistor 80 approaches that of an open circuit. Thus the delay through the element can be controlled in a more precise manner than in the previous design. If the voltage at the collectors of transistors 66 and 68 is held constant, then the maximum delay is determined by resistors 80 and 82. The minimum delay will be determined by the minimum parallel resistance of the resistors and the PFET devices. Even though the PFET devices in FIG. 2b, which allow the user to vary the resistance, have been used in delay element applications, further improvements can be made to enhance their ability to control the delay of such designs.

Accordingly, there is a need for a wide-range variable delay system that can delay multiple signals in a precise manner regardless of process, voltage, and temperature variations.

SUMMARY OF THE INVENTION

Accordingly, the present invention is directed to a wide-range variable delay system that substantially obviates one or more of the problems arising from the limitations and disadvantages of the related art.

The object and purpose of the present invention is to provide a variable delay system that provides a means for obtaining a precise delay for digital signals, which can be varied over a wide range such as is common in variable data-rate signal processing circuits.

Another object and purpose of the present invention is to provide a variable delay system that provides a delay characteristic that is invariant to process, temperature, and voltage fluctuations, and which can be trimmed to the precision required by the user.

It is also the object and purpose of the present invention to provide a variable delay system that maintains the pre-delay timing relationships of multiple signals over the full delay range of the system.

It is a further object and purpose of the present invention to provide a variable delay system that uses a novel gate-to-source voltage control and clamp circuit which reduces component parametric variations due to temperature and voltage fluctuations, and eliminates limiting resistors common to prior art delay circuits.

To achieve these and other advantages, and in accordance with the purposes of the invention as embodied and broadly described, the invention is a precision variable delay system that is intolerant of process, voltage, and temperature variations. The precision variable delay system invention contains a delay line that consists of two or more delay elements cascaded together, a voltage controller that controls the output voltage swing of the output from the delay line, a decoder that controls the total delay out of the delay line, a switch bank having one or more switches that are separately enabled by the decoder, and a delay controller that controls the amount of delay of each of the two or more delay elements in the delay line.

Additional features and advantages of the invention will be set forth in the description as follows, and in part will be apparent from the description or may be learned by practice of the invention. The objectives and other advantages of the invention will be realized and attained by the methods and apparatus particularly pointed out in the written description and claims hereof together with the appended drawings.

It is to be understood that both the foregoing general description and the following detailed description are exemplary and explanatory, and are intended to provide further explanation of the invention as claimed.

The accompanying drawings are included to provide a further understanding of the invention and are incorporated in and constitute a part of this specification, illustrating one embodiment of the invention. The drawings, together with the description, serve to explain the principles of the invention.

BRIEF DESCRIPTION OF THE DRAWINGS

The present invention is illustrated by way of example, and not by way of limitation, by the figures of the accompanying drawings in which like reference numerals refer to similar elements, and in which:

FIG. 3 is a block diagram of a wide-range variable delay system according to the present invention.

FIG. 7 illustrates a simulated delay response to increasing delay voltage according to the present invention.

FIG. 8 shows an exemplary signal delayed according to the present invention.

DETAILED DESCRIPTION OF THE INVENTION

Figure 1A:
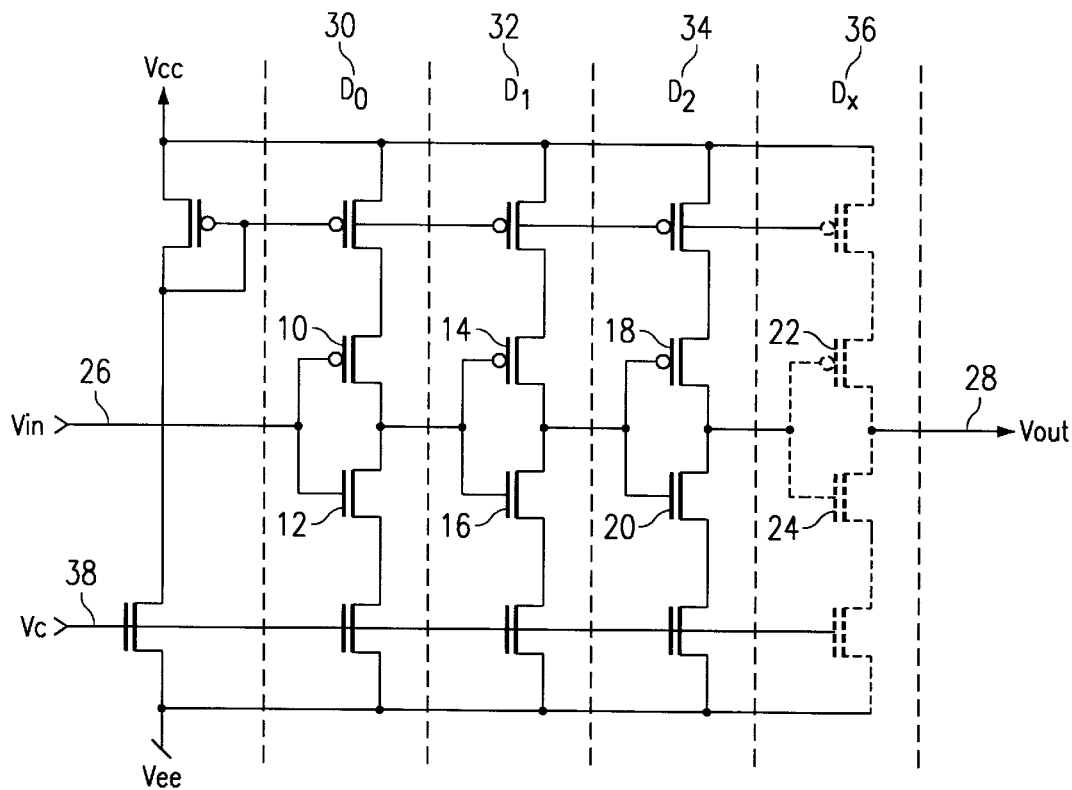
FIGS. 1a and 1b show a prior art CMOS-based method of a variable delay system.
Figure 1B:
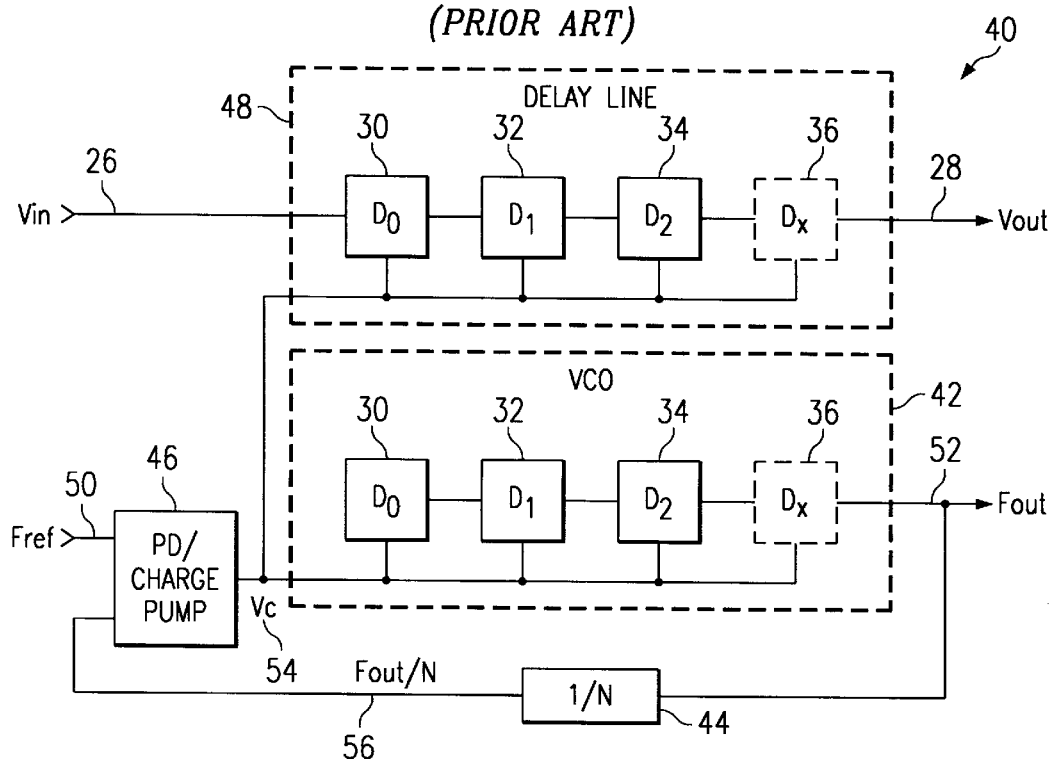

Reference will now be made in detail to the present preferred embodiment of the invention, an example of which is illustrated in the accompanying drawings. A block diagram of the exemplary embodiment of the wide-range variable delay system of the present invention is shown in FIG. 3. Preferably, this embodiment of the wide-range variable delay system of the present invention would be contained on a chip. One or more of these chips would be contained in an integrated circuit package. The delay system shown receives an input signal 102 and generates one or more output signals that are the input signal delayed by different amounts of time. A delay controller 104 supplies a voltage 106 to the delay line 100 that is used in the delay line 100 to set the amount of delay through individual delay elements that are cascaded together inside of the delay line 100. An output voltage controller 108 regulates the output voltage swing of the outputs from the delay line 100. A decoder 110 receives inputs that define what overall delay is desired from the delay line 100. These inputs are decoded by the decoder 110 to determine which delay line output is desired. A switch bank 112, connected to the outputs from delay line 100, receives input from the decoder 110 and then switches the desired delay line 100 output to an output buffer 114 that supplies the delayed output signal 116.

Figure 4:
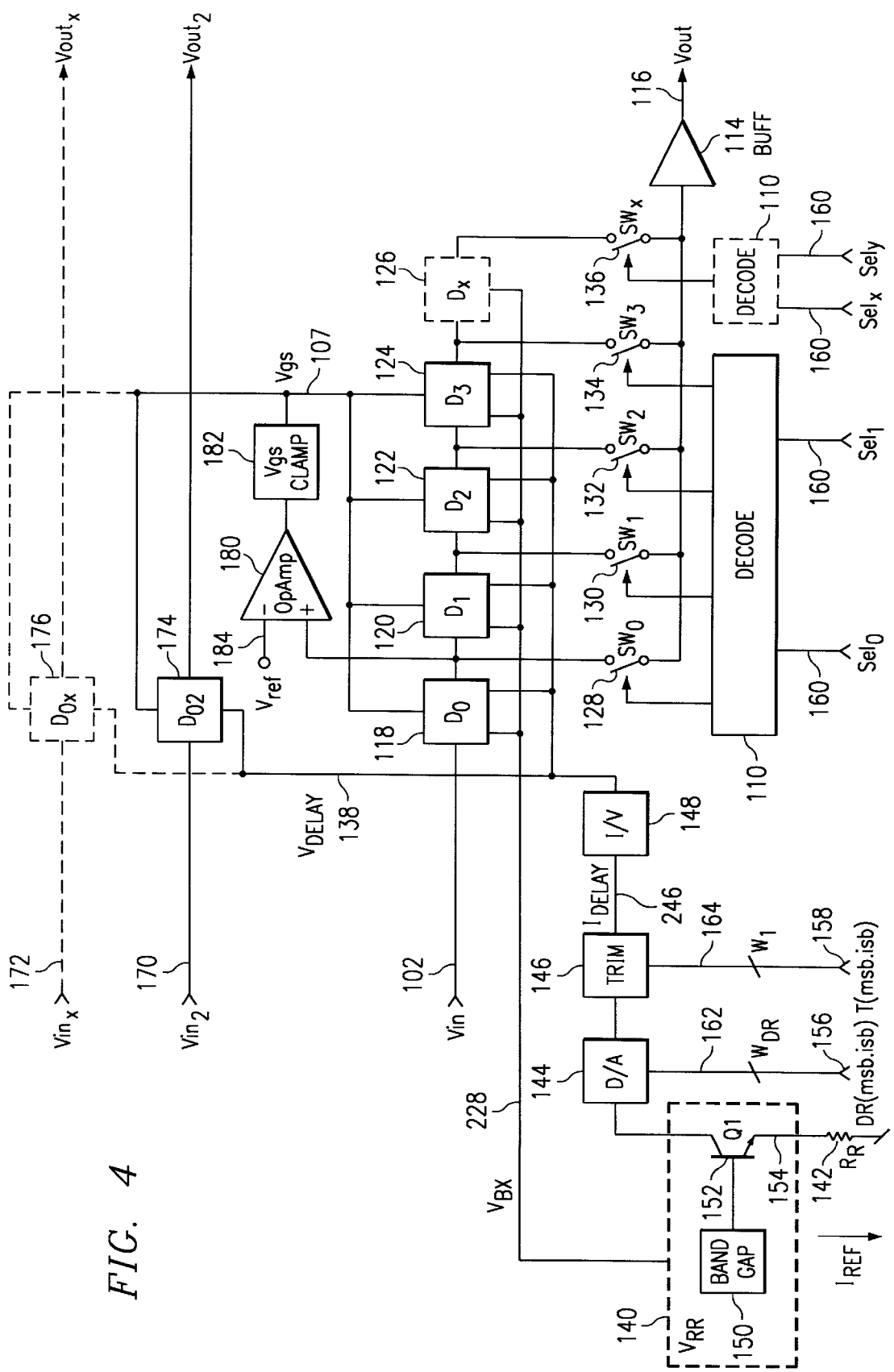
FIG. 4 is an expanded block diagram of a wide-range variable delay system according to the present invention.

An expanded block diagram showing the cascaded delay elements 118, 120, 122, 124, 126 inside the delay line 100, and the components of the delay controller 104 is shown in FIG. 4. Cascaded delay elements 118, 120, 122, 124, 126, labeled Do–Dx, are used to construct a delay line 100 whereby the input signal present at Vin 102 can be delayed by a programmable amount, as required by the user, and output at Vout 116 for use in subsequent circuits. The total delay required by the user, as well as the delay resolution, determine the number of delay elements needed to construct the delay line 100, which will vary from one application to another.

As shown in FIG. 4, the user can program the delay from Vin 102 to Vout 116 by enabling one of the switches 128, 130, 132, 134, 136, labeled as $SW_0$–$SW_x$, thereby connecting the appropriate delay element 118, 120, 122, 124, 126 output to the output buffer 114. These switches are simply MOSFET transmission gates, which are readily available on BICMOS integrated circuit processes. The decode logic 110 allows the user to enable only one of the switches at a time according to the amount of delay desired, with the $SW_0$ switch 128 enabled as the default reference delay setting. Thus, when no delay is desired, the output of delay element D 118 is connected in the signal path.

Another variable delay feature of the present invention is provided by varying the delay voltage 138 ($V_{DELAY}$) which controls the amount of delay through each delay element 118, 120, 122, 124, 126, and therefore the total system delay. Delay voltage 138 comes from the delay controller 104 which is preferably made up of a current source 140, external precision resistor 142, D/A converter 144, trimmer 146, and current-to-voltage converter 148. The current source 140 is made up of a bandgap 150 and transistor 152. The bandgap 150 is a circuit, which generates a temperature and voltage compensated reference voltage based upon the bandgap voltage of silicon (typically around 1.2 volts). Transistor 152 is also in the silicon of the chip. Bandgap 150 and transistor 152 form bandgap voltage source 140. Resistor 142 is a low tolerance (typically 1%) precision resistor, external to the chip containing the delay line system. Precision resistor 142 will not suffer from typical chip process variations since it is external to the chip. Use of a resistor on the IC chip would result in a resistor with a large tolerance (typically 20% or more) due to wafer process variations. Therefore, the bandgap voltage source 140 and resistor 142 comprise a precision current source. The delay voltage 138 is generated from the bandgap-referenced voltage 154 which is developed across precision external resistor 142. Since the current through precision resistor 142 will be compensated for temperature and voltage variations, and will not be subject to on-chip process variations, a precise current can be obtained which can then be scaled, from its full value down to zero, with a D/A converter 144 to develop a variable voltage for the delay system. The D/A converter 144 provides the user with the ability to vary the system delay with the control bus 156 that will vary the delay voltage 138 in discrete steps. The control bus 156 is external to the chip, allowing adjustment by the user at any time. The width of the control bus 162 is only dependent upon the delay resolution required by the application. For example, if the overall delay is desired to be 12 time units, but variable in 4 time unit delays, the control bus will be a certain width. However, if for the same desired overall delay, it is desired that the delay line be variable in 2 time units, the control bus will be a different width. In addition, a TRIM circuit 146, is provided which enables the chip-to-chip variations of the individual delay elements to be compensated for as well by adjusting the delay current 246. Since on-chip capacitors are used to obtain the delay characteristics of the elements, as will be described later, this compensation is provided to eliminate the absolute delay variations which may be observed from chip-to-chip as a result of process variability. The trim feature is adjusted through control of the digital bus 158, which could be set once during a wafer trim operation, or as a factory setting by the user through a serial port operation. The width of the trim bus 164 is only dependent upon the amount of absolute precision (chip-to-chip) required by the user, and is not external to the IC. The scaled and trimmed reference current is then converted to a voltage by the current-to-voltage (I/V) converter 148 of FIG. 4, which supplies the delay voltage 138 for control of the delay elements 118, 120, 122, 124, 126.

The invention provides for the matching of delays to other signals by the delay elements $D_{02}$–$D_{ox}$ 118, 120, 122, 124, 126 which delay the input signals $Vin_2$–$Vin_x$ 102, 170, 172, respectively. This is especially important for variable delay systems, since it is often critical to maintain the pre-delay timing relationships between multiple signals. As the delay of the system is varied by changing delay voltage 138 as described above, the reference delay elements $D_o$ and $D_{02}$–$D_{ox}$ 118, 174, 176 all track each other, thus maintaining the pre-delay timing of the input signals 170, 172 to the delayed input signal 102 over all conditions.

A method of controlling the output signal voltage swing of each delay element 118, 120, 122, 124, 126 is provided by the opamp 180 and Vgs clamp 182 of FIG. 4. These circuits maintain the output voltage of the delay elements 118, 120, 122, 124, 126 at the level set by the reference voltage 184. Consequently, this effectively controls the output voltage swing of the delay line. This function, along with the other features described above, serve to provide a precise variable delay which is compensated for process, voltage, and temperature variations, for single or multiple signal applications.

Figure 5:
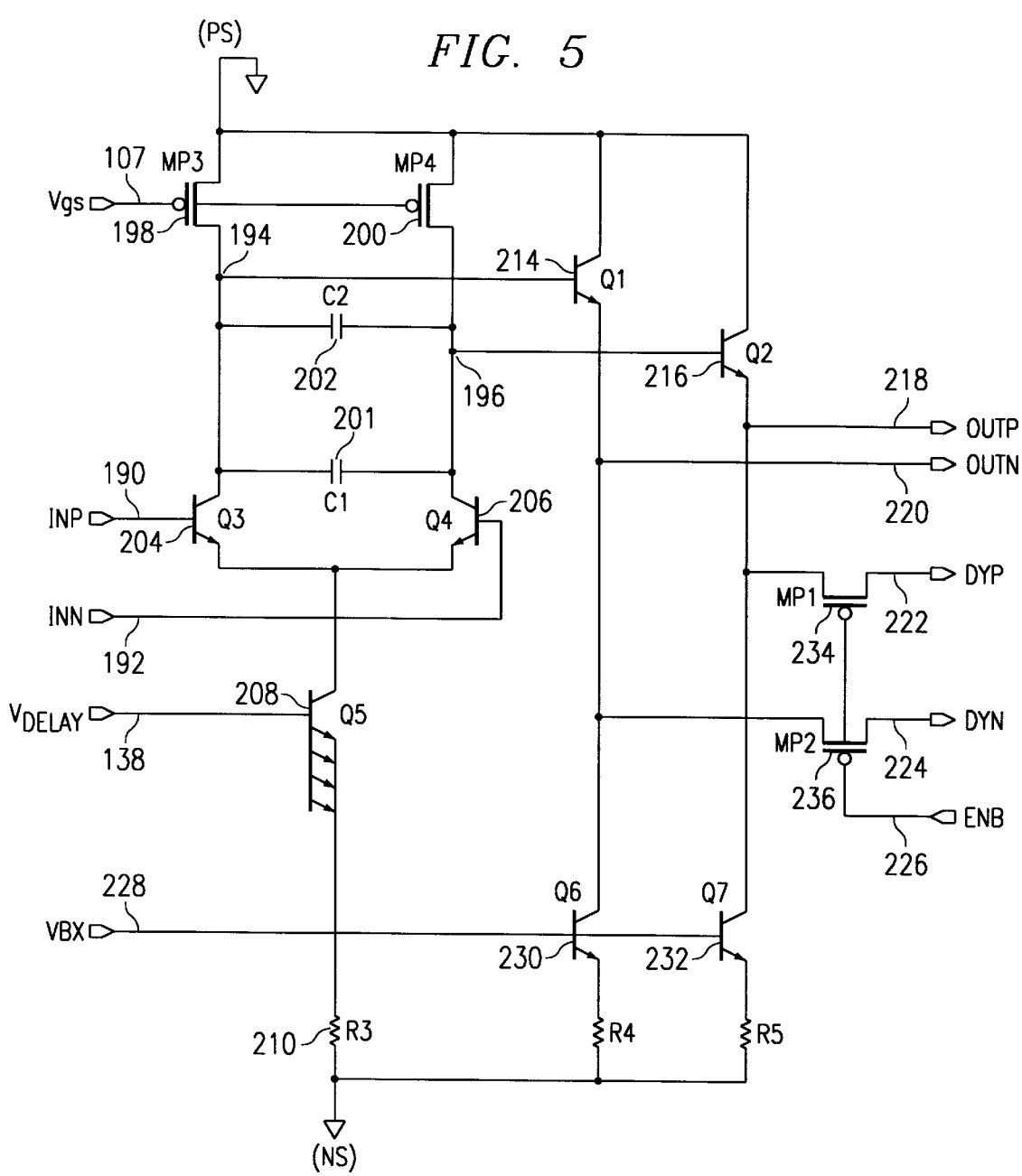
FIG. 5 is a schematic diagram of a single delay element according to the present invention.

Referring now to FIG. 5, the schematic diagram of an embodiment of a single delay element is shown according to the present invention. Differential inputs 190 and 192 are received by transistors 204 and 206, configured as an emitter-coupled differential pair. The collectors of the differential pair, nodes 194 and 196 are connected to PFET devices 198 and 200, which in combination with capacitors 201 and 202, form the variable delay portion of the delay element. Capacitors 201 and 202 are provided for at least two reasons: 1) to give the user the ability to extend the delay range of the system as may be required by the application, and 2) to dominate the parasitic capacitances at nodes 194 and 196. Thus, the capacitors serve to provide a delay characteristic which is controllable and can be trimmed to eliminate process-induced component variations.

Figure 2A:
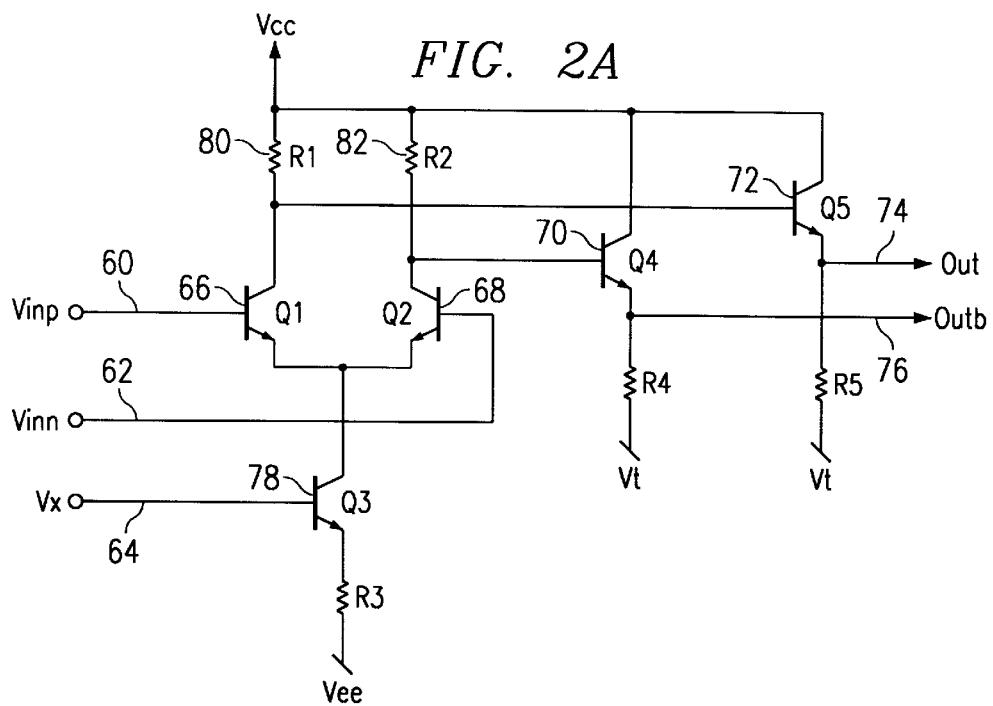
FIGS. 2b and 2b show a prior art ECL-based method of a variable delay system.
Figure 2B:
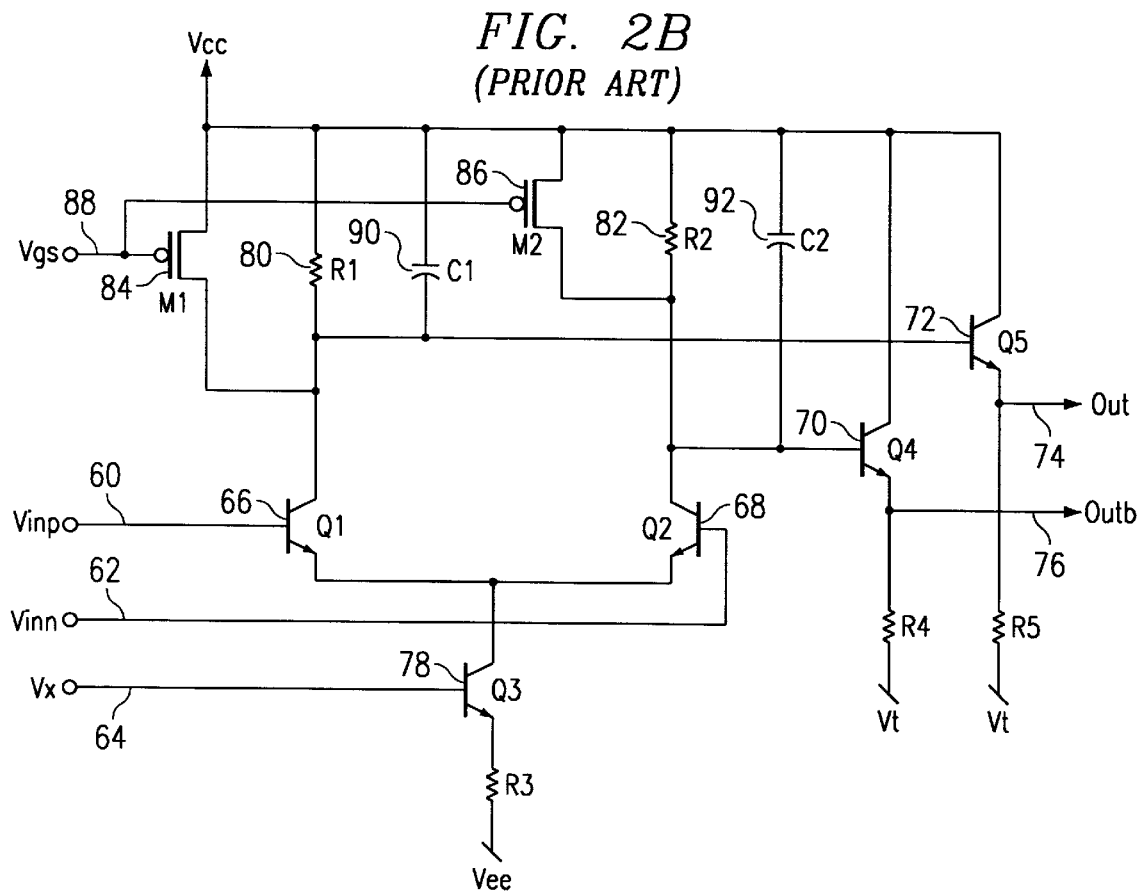

In prior applications, as previously shown in FIG. 2b, two additional resistors, 80 and 82, were also connected in parallel with the PFET devices to limit the maximum resistance at the collectors of transistors 204 and 206. This was done primarily to prevent the saturation of transistors 204 and 206 in the case where the PFET Vgs voltage 107 was unknown or not controllable. These resistors are not necessary in the present invention due to the Vgs control 180 and clamp circuit 182, which perform the same function. PFET devices 198 and 200 of FIG. 5, therefore, effectively operate as wide-range variable resistors, which along with the capacitors produce a variable RC time constant delay characteristic. Elimination of the extra resistors not only reduces the component count, but also allows higher frequency applications to be realized due to the reduced parasitic capacitances present at the collector nodes 194 and 196.

The variable delay feature of the delay element is obtained by controlling the current through the differential pair, 204 and 206, with the current source created by transistor 208 and resistor 210. As the delay voltage 138 ($V_{DELAY}$) is increased, the current through the differential pair 204 and 206 also increases. Likewise, as the delay voltage 138 $V_{DELAY}$ is decreased, the current through the transistor differential pair 204 and 206 decreases. Since the voltage at nodes 194 and 196 is held constant, the $r_{DS}$ of the PFET loads 198 and 200 will change as a function of the current present. Thus, as the current is increased, $r_{DS}$ decreases to keep the voltage at nodes 194 and 196 the same, decreasing the delay as well. Similarly, as the current through the transistor differential pair 204 and 206 decreases, the PFET $r_{DS}$ increases to keep the voltage at nodes 194 and 196 constant, thus increasing the delay. Since the resistance-capacitance combination at nodes 194 and 196 form an RC network, the corresponding delay can be expressed as the exponential time constant:

$$e^{-t/RC} = 0.5 \quad (1)$$

where $R = r_{DS198,200}$ and $C = 2*(C_{201} + C_{202})$. Since the delay of the signal from input to output is normally measured at the 50% points of the signal level, the time constant of Eqn. (1) is set equal to 0.5. Solving for the delay time t, the above equation can now be rewritten as:

$$t = RC \ln 2 = 0.69 RC \quad (2)$$

Due to the fact that the invention maintains the voltage at 194 and 196 constant, regardless of control current, we can also express the delay in terms of the load voltage and current as follows:

$$t = \frac{0.69 V_R C}{I_{CTRL}} \quad (3)$$

where $I_{CTRL}$ is the control current developed by delay voltage 138 ($V_{DELAY}$) through transistor 208 and resistor 210; and $V_R$ is the regulated voltage developed across the PFET load resistances 198 and 200.

The total delay through the delay element will be equal to the sum of three delay components: 1) the variable delay of Eqn. (3), 2) the switching delay of the input differential pair 204, 206, and 3) the delay of the output buffers. Thus, the total delay through the delay element can be expressed as:

$$t_D = t + t_{SW} + t_B \quad (4)$$

The switching delay $t_{SW}$ is a fixed value dependent upon the voltage levels and rise/fall times of the input signals. The buffer delay $t_B$ will also be a fixed value determined by the output loading and bias levels. As described above, the variable delay t will vary linearly as a function of the $I_{CRTL}$ current.

For use by subsequent delay elements, the delayed signals present at nodes 194 and 196 are buffered with emitter-followers 214 and 216 and are output at differential outputs 218 and 220. The drive capability of the output stage is controlled by voltage 228 which provides the bias for current sources 230 and 232. Voltage 228 is a temperature and voltage compensated bias voltage for stable operation under all conditions since it is a voltage derived from the bandgap.

In the preferred embodiment, the switches used to connect the delay element outputs to the output buffer are contained within the delay element itself, and are comprised of only a single MOSFET per output, 234 and 236, in FIG. 5. However, the placement and configuration of these switches may be altered at the discretion of the designer for improved performance.

Figure 6A:
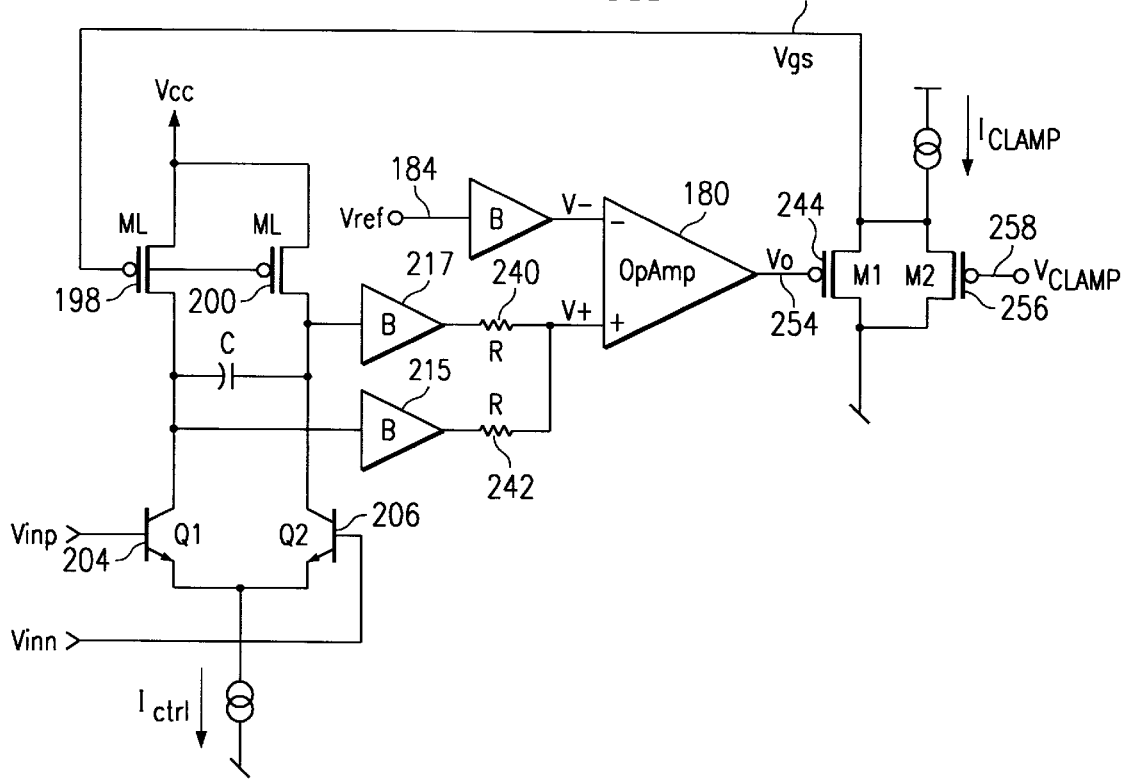
FIGS. 6a and 6b are schematic representation of the Vgs control circuit and damp according to the present invention.

A simplified schematic diagram of an embodiment of the Vgs control circuit according to the present invention is shown in FIG. 6a. The Vgs control circuit consists of resistors 240 and 242, and opamp 180. FIG. 6a illustrates how the Vgs control circuit is connected between a delay element and the Vgs clamp circuit. The current source on the emitters of transistors 204 and 206 represents the control current ($I_{CTRL}$) created by transistor 208 and resistor 210 in FIG. 5, as discussed previously. The output buffer 215, connected to the collector of transistor 204, represents the emitter follower of FIG. 5 created by devices 214 and 230.

Similarly, the output buffer 217, connected to the collector of transistor 206, represents the emitter follower of FIG. 5 created by devices 216 and 232. The Vgs control circuit maintains the output voltage swing of the delay elements at a constant value regardless of the control current ($I_{CTRL}$) magnitude. This effectively eliminates delay variations due to changes in the $V_R$ voltage of Eqn. (3), which would normally occur as the $I_{CRTL}$ current is varied. Regulation of the $V_R$ voltage also provides compensation for the process, temperature, and voltage dependent parameters of the PFET loads in the delay elements. Thus, an accurate and invariant $r_{DS}$ resistance is obtained for a given $I_{CRTL}$ current producing a stable and accurate delay characteristic.

Regulation of the $V_R$ voltage is achieved with the use of an opamp 180 which senses the common-mode voltage of the delay element outputs, compares it with a fixed reference voltage 184 (Vref), and provides a feedback voltage to the Vgs input of the delay elements. As shown in FIG. 6a, the buffered delay element outputs are summed together with the two resistors 240 and 242, and input at the non-inverting input of an opamp 180. A reference voltage 184, buffered in the same manner as the delay element outputs, is connected to the inverting input of the opamp 180. The output of the opamp 180, buffered with source-follower PFET 244, is then connected to the Vgs control node. The common-mode voltage at V$^+$ is the sum of the voltages at the collectors of transistors 204 and 206. If the common-mode voltage at V$^+$ is higher than the reference voltage 184 at V$^-$ indicating that the output voltage swing is too small, then opamp 180 increases the Vgs voltage 107 thereby increasing the $r_{DS}$ resistance of the PFET loads 198 and 200 in the delay elements. The voltage across PFETs 198 and 200 increases thus decreasing the common-mode voltage on the collectors of transistors 204 and 206.

The output voltage swing is measured as the voltage on the collectors of transistors 204 and 206 with respect to $V_{cc}$. As the $r_{DS}$ resistance across PFET loads 198 and 200 is increased, the voltage swing of the delay element outputs also increases, until the common-mode voltage matches that of the reference voltage 184. Similarly, if the output voltage swing is too large, the opamp 180 reduces the $r_{DS}$ resistance, thereby decreasing the common-mode voltage until the reference value is reached. The opamp 180 closed loop bandwidth is internally compensated, and by design is stable under all operating conditions.

Figure 6B:
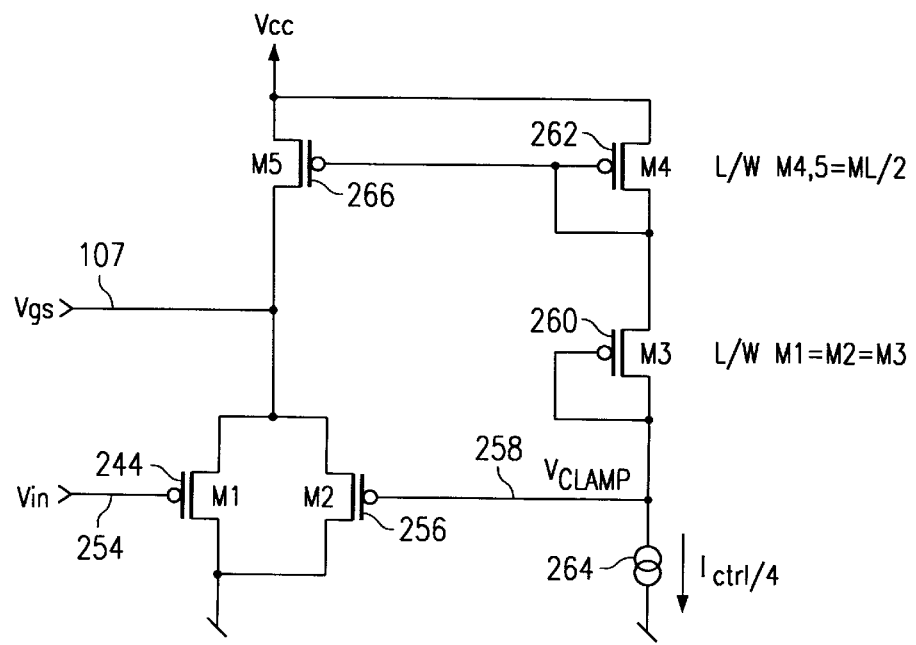

The Vgs clamp circuit is shown in FIG. 6b. This circuit eliminates the need for the voltage-limiting resistors 80 and 82 of FIG. 2b. The Vgs clamp circuit in FIG. 6b limits the Vgs voltage 107 range, and allows unlimited resistance thus permitting a wide range of delay in each individual delay element, and in the overall delay of the delay line 100. The Vgs voltage 107 will be damped so that it cannot exceed the value set by the $V_{CLAMP}$ voltage 258 plus the Vgs of PFET device 256. This effectively limits the maximum $r_{DS}$ resistance of the PFET loads 198 and 200 in the delay elements to a value which will prevent saturation of the input transistors 204 and 206.

The schematic diagram of the damp is shown in FIG. 6b, where the input voltage 254 is the output voltage of the opamp 180, and Vgs 107 is the feedback voltage to the delay elements. The clamp voltage 258 is generated by PFET devices 260 and 262, and the damp current source 264. Clamp current source 264 (Ictrl/4) is created in the same manner as the control current $I_{CTRL}$, in that it represents a transistor and resistor configured like the control current source, transistor 208 and resistor 210. The base of the transistor in clamp current source 264 is also connected to the delay voltage 138. One difference between these two current sources is that the transistor in clamp current source 264 has only one emitter, as opposed to four. This causes the clamp current (Ictrl/4) to be one quarter of the magnitude of the control current $I_{CTRL}$.

The clamp voltage 258 is equal to:

$$V_{CLAMP} = V_{CC} - Vgs_{262} - Vgs_{260} \qquad (5)$$

for a given value of $I_{CTRL}$. $Vgs_{262}$ and $Vgs_{260}$ are the gate-to-source voltages of PFET devices 262 and 260 respectively. By selecting the size and current density of PFET devices 262 and 266 to be one-half that of the size and current density of PFET loads 198 and 200 of FIG. 6a, the $r_{DS}$ resistance of PFET loads 198 and 200 is limited to approximately twice the normal operating resistance for a given $I_{CTRL}$ current. Thus, the voltage swing across the delay element PFET loads 198 and 200 is limited to about twice the normal value, preventing the saturation of the input transistors during times when the Vgs voltage 107 is not controlled. The Vgs voltage 107 is not controlled when the chip containing the delay line is first powered up and the opamp 180 has not started regulating.

The designer of the delay line determines what is a normal, or desired voltage swing based on what type of delay characteristics are desired. PFET devices 198 and 200 are also selected based on the desired delay characteristics. The maximum voltage swing allowable is determined based on the bias voltage of transistors 204 and 206, and the supply voltage being used. The desired maximum voltage swing is determined by the designer and may be less than the actual maximum voltage swing allowable. The ratio of the desired maximum voltage swing to the desired normal voltage swing determines the selection of PFET devices 262 and 266. In this embodiment of the present invention, a ratio of 2 to 1 has been chosen. However, other ratios are possible and could be chosen by the designer to better match his design constraints. The selection of PFET devices 244,256, and 260 is not as critical, as long as these devices are matched.

During operation of the delay line system, once the designer has determined the desired delay, the control current $I_{CTRL}$ will be fixed. Since the clamp current Ictrl/4 is scaled to the control current, it will also be fixed. Note that since both current sources are controlled by the delay voltage 138, if the delay is changed, these two currents will change proportionally. As the opamp 180 output voltage 254 increases, the Vgs voltage 107 will increase until it is damped by PFET 256 as it turns on and PFET 244 turns off. PFET 256 will turn on when the Vgs voltage 107 increases to a value equal to the clamp voltage 258 plus the gate-to-source voltage across PFET 256. Anytime PFET 256 is on, the gate-to-source voltage across PFET 256 will be fixed. Since the clamp current is fixed, the voltage drops across PFETs 260 and 262 will also be fixed. Therefore, the clamp voltage 258 is fixed. With the gate-to-source voltage across PFET 256 fixed and the clamp voltage 258 fixed, the Vgs voltage 107 will be clamped and fixed to the sum of these two voltages. This limits the maximum $r_{DS}$ resistance of the PFET loads 198 and 200 in the delay elements to a value which will prevent saturation of the input transistors 204 and 206.

Since the clamp voltage $V_{CLAMP}$, 258 also varies as a function of $I_{CTRL}$ the limiting action of the clamp is maintained as described above over the full delay range of the system. The size of PFET device 260 is matched to that of PFET source-followers 244 and 256, to eliminate any offset in the Vgs voltage 107 which would occur otherwise.

FIGS. 7 and 8 show simulated responses of the variable delay system to digital input signals for a hard-disk drive application. The wide-range feature of the invention is displayed in FIG. 7, where the delay time of a single delay element is plotted as the $V_{DELAY}$ voltage is varied over a 10:1 range. The X-axis corresponds to the scaling of the delay current 246 ($I_{DELAY}$) which generates the delay voltage 138 ($V_{DELAY}$) in FIG. 4. The Y-axis is the resulting delay through the delay element. The delay current 246 with a coefficient of 10 is one tenth of the delay current with a coefficient of 1. Simulation results show the invention to possess a linear delay characteristic which can be controlled with precision over a greater-than 10:1 range.

FIG. 8 shows the delay of a typical digital signal through a 15-tap delay line, as each succeeding delay element output is selected by the decode logic.

The invention described herein provides the means of obtaining a precision electronic delay which has wide variability and is intolerant of process, voltage and temperature variations. The invention has direct applications in BICMOS integrated circuits where ECL delay elements are required to implement ring oscillators or tightly controlled variable delay lines. In the field of disk storage products, for which the invention was first used, the variable delay system of the present invention provides a precise means of delaying the RLL code-rate dock with respect to the user write data. Due to the common use of zone-field recording methods in such applications, the frequency of the delayed signals can vary over a wide range requiring variable delay characteristics as well. The invention accurately delays such signals over a greater than 10:1 range while maintaining their pre-delay timing relationships and pulse width characteristics.

Future applications of the invention could be made in the area of write precompensation, voltage-controlled oscillators, window generation, and timing recovery in addition to its present use in a magneto/optical (M/O) disk drive to delay the write/laser interface dock with respect to write data.

It will be apparent to those skilled in the art that various modifications and variations can be made in the wide-range variable delay system of the present invention without departing from the spirit and scope of the invention. Thus, it is intended that the present invention cover modifications and variations of this invention provided they come within the scope of the appended claims and their equivalents.

What is claimed is:

1. A precision variable delay system that is invariant of process, voltage, and temperature variations comprising:

a delay line having two or more delay elements cascaded together;

a voltage controller, said voltage controller operatively connected to said delay line, said voltage controller controlling the output voltage swing of said delay line;

a decoder, said decoder operatively connected to said delay line, said decoder selecting the overall delay outputted from said delay line;

a switch bank, said switch bank operatively connected between said decoder and said delay line, said switch bank having one or more switches enabled by said decoder; and a controller operatively connected to said delay line, said controller controlling the amount of delay for the two or more delay elements in said delay line wherein said controller comprises:

a current source said current source supplying a current that is independent of process, voltage, and temperature variations;

a D/A converter operatively connected to said current source, said D/A converter controlling the amount of delay of the two or more delay elements in said delay line;

a second controller operatively connected to said D/A converter, said second controller controlling the delay of the two or more delay elements to compensate for chip-to-chip delay variations of the individual said two or more delay elements; and a converter operatively connected to said second controller, said converter converting current from said second controller to voltage.

2. The system claimed in claim 1 wherein said D/A converter is programmable so as to allow variable adjustment of the amount of delay of the two or more delay elements in said delay line.

3. The system claimed in claim 1 wherein said second controller is programmable so as to allow variable adjustment of the amount of delay of the two more delay elements in said delay line.

4. The system claimed in claim 1 wherein said current source comprises a bandgap voltage source coupled to a low-tolerance resistor.

5. The system claimed in claim 2 wherein the two or more delay elements use a temperature and voltage compensated bias voltage, said bias voltage controlling the voltage swing of the output from the two or more delay elements.

6. The system claimed in claim 1 further comprising a buffer operatively connected to the output of said delay line.

7. The system recited in claim 1 wherein each one of the two or more delay elements comprise:

a first transistor, said first transistor receiving a positive input signal to said delay element on the base of said first transistor, a second transistor, said second transistor receiving a negative input signal to said delay element on the base of said second transistor, the emitter of said second transistor operatively connected to the emitter of said first transistor, said first transistor and said second transistor forming a differential pair;

a current source operatively connected to the emitters of said first transistor and said second transistor, said current source controlling the delay through said delay element by varying the current flow through said first transistor and said second transistor;

a first PFET resistive load operatively connected to the collector of said first transistor and to a power source, the gate of said first PFET resistive load operatively connected to said voltage controller;

a second PFET resistive load operatively connected to the collector of said second transistor an to the power source, the gate of said second PFET resistive load operatively connected to said voltage controller;

a first capacitor, the positive plate of said first capacitor operatively connected to the collector of said first transistor, and the other plate of said first capacitor connected to the collector of said second transistor; and a second capacitor, the positive plate of said second capacitor operatively connected to the collector of said second transistor, and the other plate of said second capacitor connected to the collector of said first transistor.

8. The system recited in claim 7 wherein the output voltage swing of said delay line is controlled by said voltage controller controlling a voltage on the gates of said first PFET resistive load and said second PFET resistive load, said voltage limiting the drain-to-source resistance of said first PFET resistive load and said second PFET resistive load.

9. The system recited in claim 8 wherein the voltage limiting the drain-to-source resistance of said first PFET resistive load and said second PFET resistive load is controlled by a second current source, said second current source controlled by said current source.

10. The system recited in claim 9 wherein said second current source is scaled to clamp the drain-to-source resistance of said first PFET resistive load and said second PFET resistive load.

11. The system recited in claim 8 wherein the voltage limiting the drain-to-source resistance of said first PFET resistive load and said second PFET resistive load is maintained over the full range of the delay line.

12. The system recited in claim 9 wherein the ratio of the clamped drain-to-source resistance of said first PFET resistive load and said second PFET resistive load is set to any value desired.

13. A method for precision delay of a signal, said delay invariant of process, voltage, and temperature variations, said method comprising the steps of:

cascading two or more delay elements to form a delay line;

controlling the delay of said two or more delay elements;

decoding at least two inputs that determine the desired overall delay from said delay line;

switching the desired overall delay from the output of one of the cascaded two or more delay elements to the output of said delay line based on said delay line, wherein the voltage is formed from converting a current to the voltage.

14. The method claimed in claim 13 wherein the current is adjusted, said adjustment setting the delay through each said two or more delay elements.

* * * * *